United States Patent [19]

Schwartz et al.

[11] 4,225,944
[45] Sep. 30, 1980

[54] BUBBLE MEMORY CHIP ORGANIZATION-FOLDED LOOP TYPE

[75] Inventors: Sidney J. Schwartz, Vista; Chung H. Hsin, San Diego, both of Calif.

[73] Assignee: Burroughs Corporation, Detroit, Mich.

[21] Appl. No.: 901,357

[22] Filed: May 1, 1978

[51] Int. Cl.³ ............................................. G11C 19/08
[52] U.S. Cl. ........................................ 365/15; 365/12; 365/16
[58] Field of Search ...................... 365/12, 15, 16, 13

[56] References Cited

U.S. PATENT DOCUMENTS

| | | | |
|---|---|---|---|
| 3,711,842 | 1/1973 | Chow | 365/17 |
| 3,916,397 | 10/1975 | Takahashi | 365/15 |
| 4,075,709 | 2/1978 | Chen et al. | |

Primary Examiner—James W. Moffitt
Attorney, Agent, or Firm—Joseph R. Dwyer; Kevin R. Peterson

[57] ABSTRACT

A bubble memory organization with a plurality of storage loops in-plane folds allows the selective spacing of transfer and other functional elements from each other eliminating crowded conditions at loop ends. This permits the selective placement of the functional elements for the maximization of operating margins. This can also lead to reduced current requirements because passive replicate elements may be used, to reduced transfer line impedances, to reduced number of conductor lines and to a reduced number of transfer points per memory array. For the designs where passive replication is chosen, reliability is improved due to the reduction in current density to levels further below the conductor electromigration thresholds.

25 Claims, 6 Drawing Figures

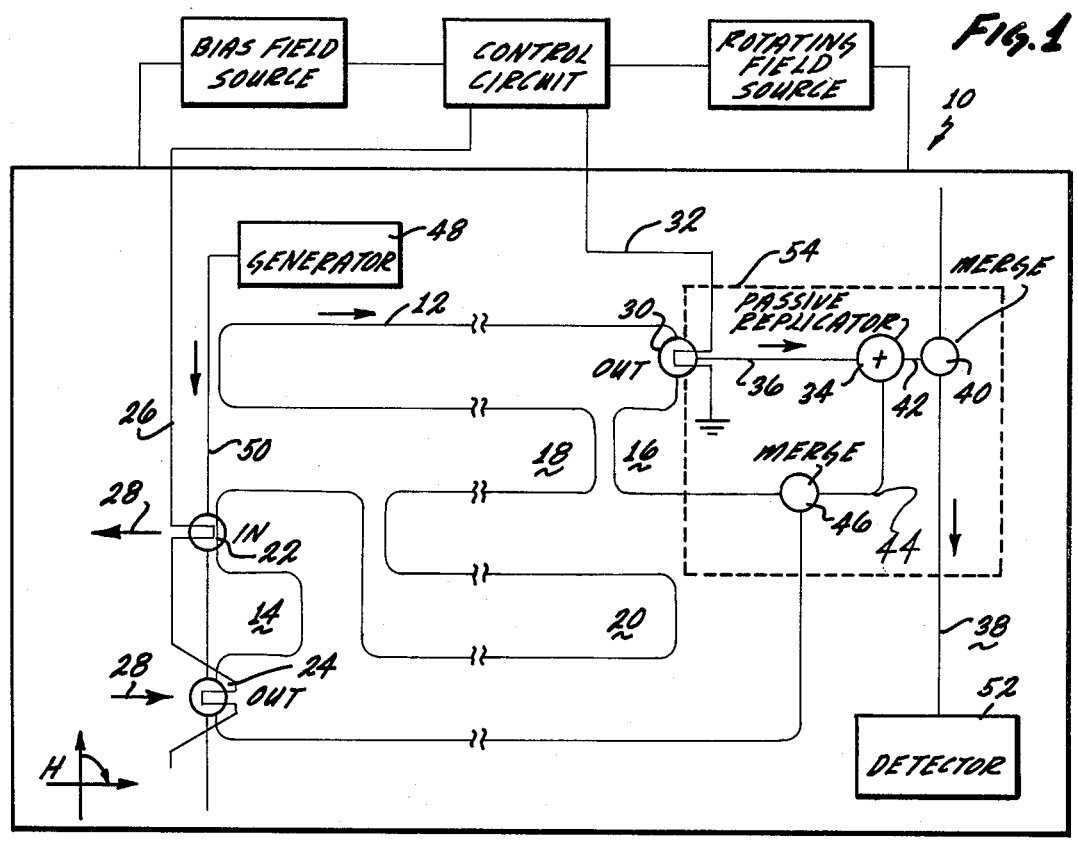

BUBBLE MEMORY CHIP ORGANIZATION-FOLDED LOOP TYPE

BACKGROUND OF THE INVENTION

The present invention relates to magnetic bubble memory devices and particularly to improvements in the arrangement of the storage and gating functions in a magnetic bubble array.

The conventional major minor and block replicate type of bubble memory chip arrays utilize bubble storage means formed of a selected type of propagate elements arranged in loops with transfer-in and transfer-out and/or replicate gates (ports) located at the ends of each loop. These loops, called storage loops, have bubbles continuously circulating therein in response to an in-plane rotating magnetic field. These loops are normally elongated with the gating function located at the corner turn for the bubble propagating therein. Since this corner turn is a 180 degree turn, the propagate and other functional elements are crowded at this point and, often, the lowest magnetic margins exist because of these crowded conditions. This problem is impacted further as bubble sizes diminish and chip sizes increase.

Stated another way, in a normal bubble memory arrangement having a plurality of storage loops, it is conventional to provide a transfer function at the ends of each of the loops, ie. two ports for each loop. Take first a chip of a fixed size with a given bubble size, as an example, a chip utilizing four micron bubbles in an array of 100 storage loops having a transfer-in port at one end and a replicate port at the other end. If a chip of the same size is now selected to use two microns bubbles, then 200 storage loops would be required and the loop lengths would be twice as many bits long. This now has increased the number of transfer-in ports from 100 to 200 and the replicate port number also increased from 100 to 200. This means that with the two micron bubbles, smaller ports are used requiring thinner metalization but since there are twice as many ports, the transfer line resistances have more than doubled. This increase places a burden on the driving circuitry because the voltage required of the drive control circuits continues to increase beyond the range of low cost readily accessible electronics.

The object of this invention is to provide a means for reducing the transfer impedances in a bubble memory array as bubble sizes diminish and/or chip sizes increase and thus decrease the burden on the driving circuitry therefor.

A second object of this invention is to provide a memory array with a means for transferring and for other functions operable at a lower current in a loop configuration with an accompanying reduction in control conductor thickness and chip yield improvements.

A still further object of this invention is to provide a memory array with greater flexibility in arranging the timing between transfer ports and between other functional elements by selecting the number of propagate elements (steps) between such ports and elements.

SUMMARY AND FURTHER ADVANTAGES OF THE INVENTION

The bubble memory arrangement which accomplishes the foregoing objects of this invention comprises a bubble memory array with the storage loops with in-plane folds to allow more space for the transfer and other functions per loop.

Thus, utilizing a folded loop configuration as described and claimed herein, the number of transfer ports are reduced and more space is provided at each port thus eliminating the crowded conditions at the turns of the loop of the conventional array where operating margins may be low.

Further, with the increase in the space available by the folded loop configuration, different photolithographic requirements for the storage loop section and the detecting and/or transfer-in/transfer-out areas can be realized so that the size and spacing between the propagate elements can be tailored to the requirements for the various areas, all within conventional photolithographic resolutions.

Another advantage of the folded loop configuration and the increase in space available is that the means for routing the wiring for the conductors to operate the transfer and other functional elements may be spaced so that such wiring will not effect the operation of the remainder of the chip and, too, passive replicators or other low current replicators may be utilized, eliminating the relatively high current requirements of conventional replicators typically used in block replicate bubble chip designs. This reduction in current improves the reliability by operating the conductor at a current density farther from the electromigration threshold.

A reduction in the thickness of the conductor layer can be used in lieu of a current density reduction so that the subsequent steps in the manufacture of the array may experience improvement in processing yields.

The foregoing advantages and other advantages will be apparent to those skilled in the art after a study of the following description of the operation of the invention.

BRIEF DESCRIPTION OF THE DRAWINGS

FIG. 1 shows a portion of a bubble memory chip organization showing a folded storage loop configuration on the storage area to accomplish a low current system without annihilators but with two transfer gates on the input track on a single conductor line for clear, space and transfer of data functions and a second transfer-out gate followed by a passive replicator for reading the data in the storage loop, FIG. 2 is also a portion of a bubble memory chip organization showing folded storage loop configuration on the storage area with low current replication and an annihilator in each replicate area.

BRIEF DESCRIPTION OF THE PREFERRED EMBODIMENT

Figure 3:
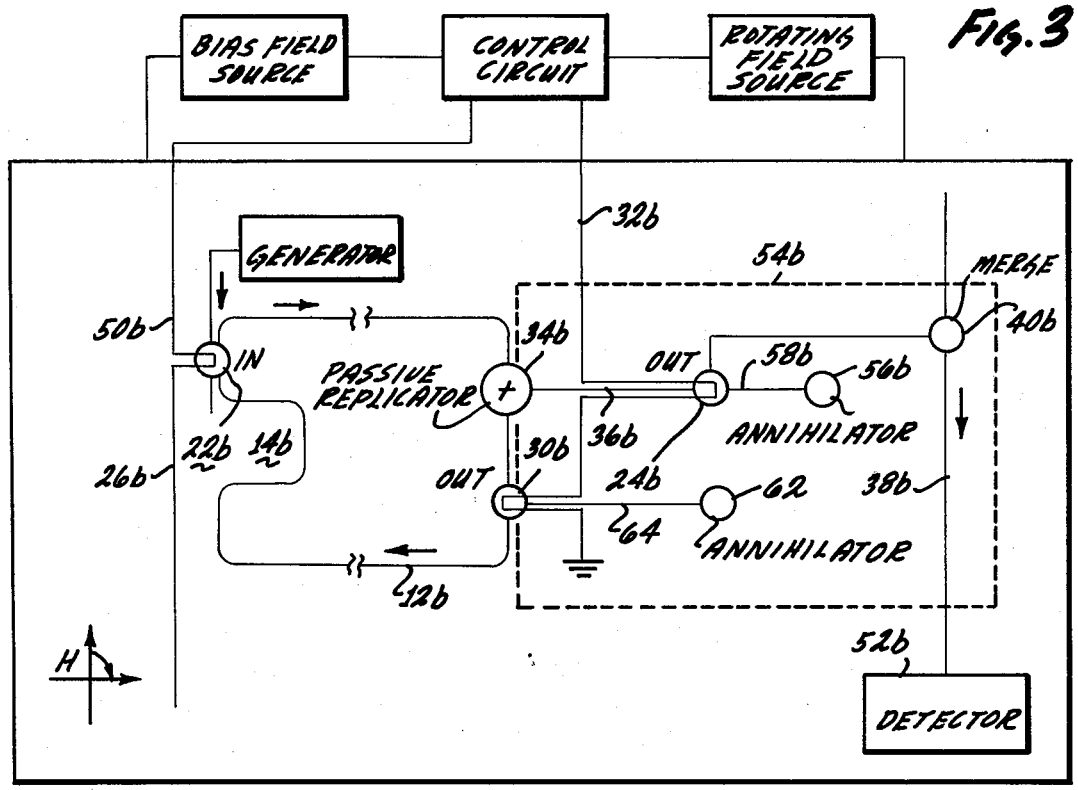
FIG. 3 is also a portion of a bubble memory chip folded storage loop organization with a replicator in the storage loop itself and also showing the separate storage area and detector area.

Referring first to FIG. 1, it can be seen that there is disclosed a portion of a bubble memory organization on which conditions exist for establishing single wall domains or bubbles on suitable magnetic material, such as epitaxial magnetic garnet film, on a nonmagnetic garnet substrate, all of which are well-known in the art and identified as 10 herein. Patterns of magnetically soft overlay material (e.g., permalloy) forming of propagate elements are commonly employed and typical examples of such propagate elements are known as T-bar, half-disk, contiguous disk, and chevron elements. The T-bar, half-disk, and asymetrical chevron elements are commonly employed in the storage area.

Also, in the conventional bubble memory storage area, a series of identical storage loops are formed of a selected type of propagate elements and are usually stacked or vertically aligned with transfer ports usually including a write-in means, comprising an input track and a transfer-in gate or port and a read-out means comprising an output track and a replicator and/or a transfer-out gate or port. Thus, a bubble entering a storage loop from the transfer-in port, since the loop closes on itself, will circulate indefinitely in response to a rotating in-plane magnetic field unless transferred out. Suitable bias sources and control circuits including auxiliary circuits such as pulsing circuits for the application of pulses to the transfer ports and other functional elements are well-known and for the purpose of this disclosure are shown in FIG. 1 only in block diagrams.

In the illustrated embodiments of this invention, a number of storage loops, one being shown at loop 12, formed of propagate elements shown as a line, contain a number of folds in the same plane of the loop but extending inwardly in a generally U-shaped form and are identified in FIG. 1 as 14, 16, 18 and 20. These folds form an important aspect of this invention, since the introduction of the folds into the storage loops allows the number of propagate elements and consequently the number of cycles of the rotating field, to be selectable so as to properly time the propagation of the bubbles, not only in the loop 12, but to other functional elements of the organization. Thus, for example, a transfer-port 22 and a transfer-out port 24 are separated by fold 14 and activated by a single conductor 26, since they are 180 degrees out of phase; the phases are illustrated by the arrows 28. In the embodiment disclosed, also, the output gate 24 performs a clear function, since a second output gate 30 performs the function of transferring bubbles from the loop for reading the data from the memory. This transfer gate, activated by a single conductor line 32 is connected to a passive replicator 34 by a plurality of propagate elements shown as line 36. Thus, a bubble transferred out by the function of transfer-out gate 30 is replicated with one portion of the bubble being transferred through a merge port 40 via line 42 to the transfer-out line 38 and the other portion being transferred by line 44 to a merge port 46 where it reenters the storage loop. Again, fold 16 in the storage loop 12 functions to properly time the bubbles as they propagate from transfer-out element 30 to the merge port when no replication of bubbles is desired.

It is to be noted, that a single drive conductor 26 is connected to the transfer-in port 22 and a transfer-out port 24 to operate these ports in a swap function, and it is further to be noted, that there is no drive conductor connected to the passive replicator so that the system may be operated with a minimum current, since no high current splitting of bubbles is required.

In the operation of this embodiment in response to the in-plane magnetic field, after having been generated at the generator 48, bubbles are transferred along the line of propagate elements 50 and transferred into the loop 12 at transfer-in port 22. There, bubbles continuously flow in the loop 12 and upon the application of a suitable pulse applied to the control line 32, a bubble may be transferred out of the loop so as to propagate along line 36 to the passive replicator 34 where the bubble is split; one portion going to the merge port 46 via line 44 and the other portion going through merge port 40 via line 42 to a detector 52 along line 38. The passive replicator 34 permits the data to be read out in the detector 52 without destruction from memory. On the other hand, if the control line 32 is not pulsed at the time the bubble reaches a transfer-out port 30, the bubble will continue on the loop through the merge point 46 and continue on the loop 12. Again, the folds 16 permits the control of the number of pulses and the number of propagate elements from the proper timing of the bubbles in the propagate system. Thus, the time for line 36 through the passive replicator down to line 44 and into the merge port equals the time required for bubbles to propagate from past the transfer-output port 30 to the merge point in the loop. If the transfer-out port 24 is activated at the right time by the application of a pulse from the conductor 26, a bubble, if present, is automatically transferred out performing a clearing function allowing the transfer of new information (bubbles) into the loop at transfer-in port 22. Thus, port 24 allows the clearing of previously stored data from the location that the new data is to be stored in at port 22.

At this point it should be noted that, in this embodiment, the spacing between the passive replicator, the two transfer-out ports 24 and 30 and the transfer-in port 22, as well as the merge point 46, is preselected and thus may be suitably timed in response to the rotating magnetic field by the size and number of folds such as 14-20. This gives the desirable control over the spacing and timing of this bubble memory architecture. Also, since only one control line is required for the transfer-in port and the clear port and only one line for the transfer-out port to the passive replicator, the control line itself may be made of a wider conductor material for much of its length thus reducing the impedance of the transfer elements and reducing the voltage requirements of the control circuit to operate this organization. Notable, also, is the fact that the bubble storage area is separated from the replicator, merge and detector area which permits different circuit elements periods to be used to simplify mask alignment requirements. This difference in area margin requirements is shown in dotted lines at 54.

Turning now to FIG. 2, those elements having the same functions as the function described in connection with the elements of FIG. 1 are given the same reference numeral except for a suffix "a". This simplifies the description of this embodiment.

It is to be noted, in this embodiment, that the fold 14a in this case is located between the transfer-out port 30a and merge port 46a while two other folds 18a and 16a permit the transfer of the bubbles to be suitably timed in response to the rotating magnetic field for desirable control over the spacing and timing of this architecture. In addition, in this embodiment, control line 26a is connected only to the transfer-in gate 22a while the control conductor 32a is connected to the transfer-out gate 30a and to the second transfer-out gate 24a, the latter being connected to an annihilator 56.

In the operation of this embodiment in response to the in-plane magnetic field, bubbles, after having been written in at the transfer-in port to 22a, flow continuously in the loop 12a and upon the application of a suitable pulse applied to the control line 32a, are transferred out of the loop 12a so as to propagate along the line of propagate elements 36a to the passive replicator 34a where each bubble is split; one portion going to the merge port 40a via line 42a and the other portion traveling along 44a to the transfer-out gate 24a. On the other hand, if the control line 32a is not pulsed at the time the bubble reaches the transfer-out port 24a, the bubble will continue along the line of propagate elements 44a back to the merge point 46a where it will again reenter the loop 12a. If the transfer-out port 24a is, however, activated by an application of a pulse on the conductor 32a, the bubble is automatically transferred to the annihilator 56 via a line of propagate elements 58. In the meantime, the other portion of the replicated bubble travels along the line 42a to the merge port 40a and along the line 38a to the detector 52 where it is sensed.

At this point it should be noted that, in this embodiment, the spacing between the passive replicator and the two transfer-out ports 30a and 24a is preselected and the timing in response to the rotating magnetic field is determined by the sides and number of folds such as 14a-18a. Again, since only one control line is required for the two transfer-out ports and only one line for the transfer-in gate 22a, the lines may be made of wider conductor material over much of its length thus reducing impedance and voltage requirements of the control circuit. Again, it should also be noted that the bubble storage area which comprises a plurality of storage loops, such as 12a, being separated from the replication and annihilation area and from the detector area, permits different current element periods to be used to simplify alignment requirements. This is illustrated in the drawings by the dotted lines surrounding the passive replicator and annihilator area and indicated by the reference number 54a.

Turning now to FIG. 3, this organization utilizes a similar folded loop configuration 12b but the replicator 34b, again, a passive replicator, is located in the loop 12b itself so that bubbles are automatically replicated and portion thereof propagated to a transfer-out gate 24b along a propagate element 36b. Transfer-out gate 24b is in turn connected by a line of propagate elements 58b to an annihilator 56b. However, in this embodiment, in lieu of the merge point 46, transfer-out gate 30b is located in the loop 12b and connected to a second annihilator 62 by a line or propagate elements 64.

Again, in this embodiment, for simplicity of description, those elements having the same functions as the functions described in connection with the elements of FIGS. 1 and 2 are given the same reference numeral except for the suffix "b".

In the operation of the third embodiment of FIG. 3, after the bubble is replicated at the passive replicator 34b, one portion is transferred to the line 36b while the other portion is allowed to continue along the loop 12b to the transfer-out gate 30b. If the transfer line 32b is not activated, the bubble will continue in the loop 12b and, in the meantime, the portion of the bubble on line 36b. Upon reaching the transfer port 24a and if the conductor 32b is not pulsed, the bubble portion will propagate to merge port 40b and line 38b to be read by detector 52b.

On the other hand, if the conductor 32b is activated when the bubble reached transfer-out port 24b, the bubble will be transferred along the line of propagate elements 58b to the annihilator 56b and at the same time the bubble i.e., the replica of the bubble in annihilator 56b, will be at transfer-out port 30b and will be transferred to line 64 and onto the annihilator 62. Again, utilizing only one transfer line, the two portions of the replicate bubble may be annihilated by the activation of the transfer-out ports simultaneously if a "clear" is the desired signal.

Figure 4:
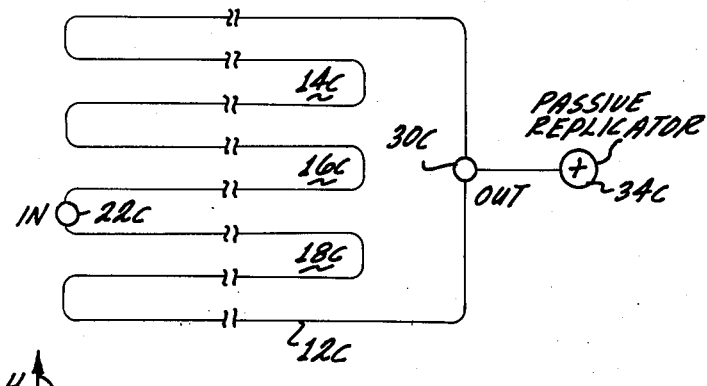
FIGS. 4 and 5 are portions of a bubble memory chip organization illustrating a folded storage loop configuration incorporating the principle of adjusting the propagation delay between the transfer-out port and the transfer-in port.
Figure 5:
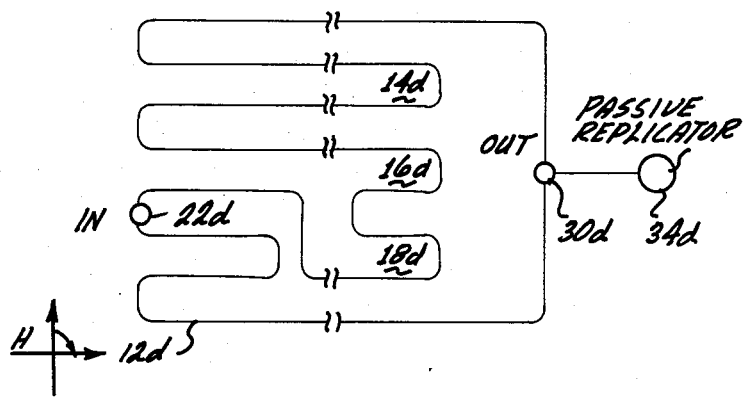

Now turning to FIGS. 4 and 5, there is shown two in-plane folded storage loop configurations utilizing the teachings of this invention to show how a loop can be configured to adjust the propagate tme between the transfer-in port such as 22c and 22d and the transfer-out ports such as 30c and 30d for proper timing sequence to a replicator and other gating functions. In the Figures, as in the prior Figures, those functional elements having the same function as in the prior Figures are given the same reference numeral except with a suffix "b" or "c". After description of the foregoing FIGS. 1-3, it is not believed that a description of the operation of these Figures is necessary.

Figure 6:
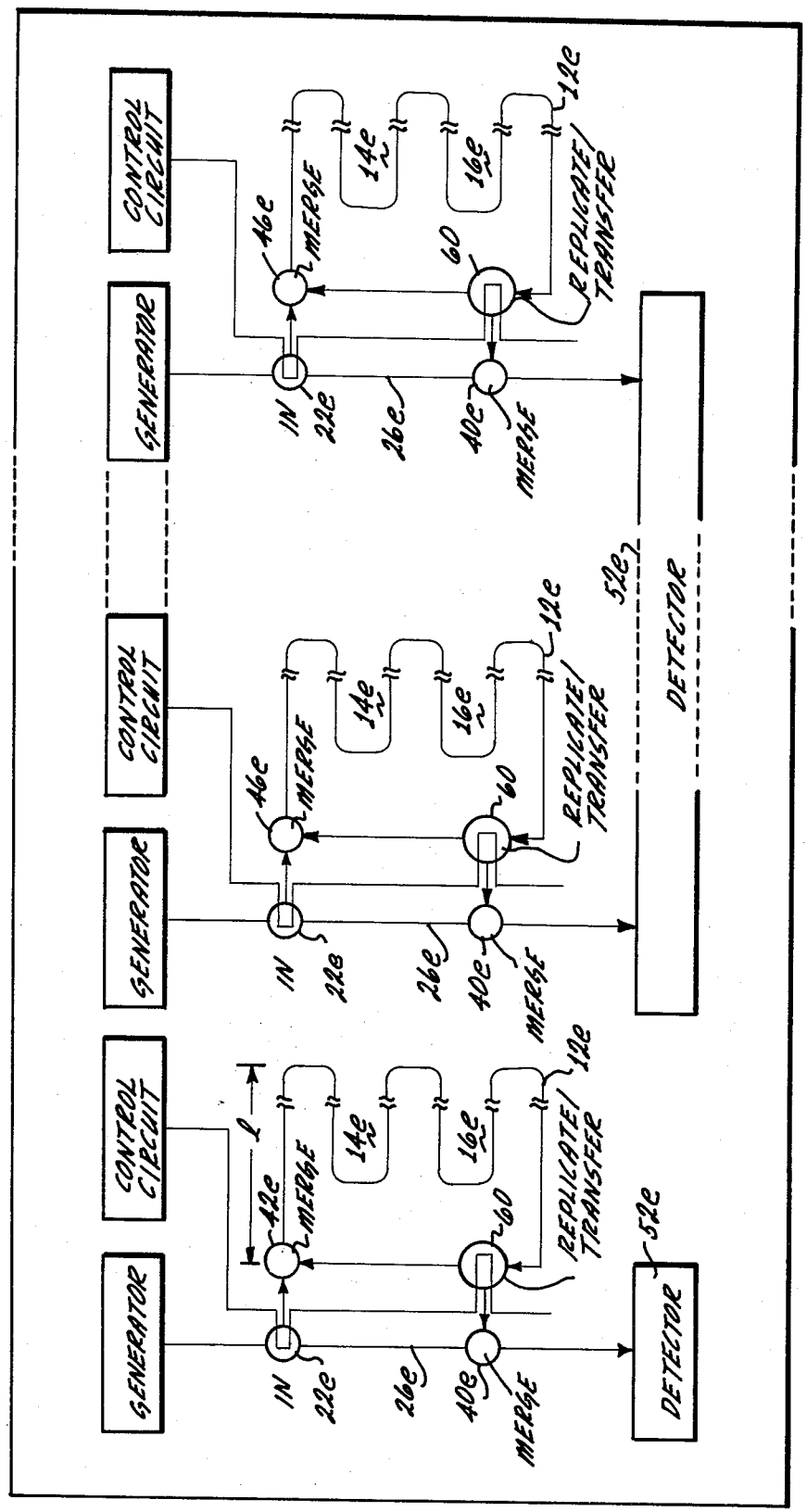
FIG. 6 is a portion of a bubble memory chip organization with a folded loop configuration illustrating the principle of providing both transfer-in and replicate/transfer-out from one side of an array of folded loops allowing the use of a single conductor for both of these functions and the adjusting of the length of the folded loop independent of the number of loop folds. A number of independent storage arrays may share a common bubble expander detector.

Turning now to FIG. 6, there is shown a multi-inplane folded loop configuration utilizing the teachings of this invention to show how a loop can be configured using an active replicator and a transfer-in gate so that the length of the loop can be adjusted independent of the number of loop folds thus achieving a fixed loop delay and allowing an independent choice of the number of folds for reducing a gate conductor impedance while increasing the space for more complex gating elements. Note, in this Figure, there is additional space provided between the transfer-in port 22e and the initial merge port 46e where bubbles enter into loop 12e and between the active replicate/transfer-out gate 60 and the merge port 42e. Again, in this Figure as in the prior Figures those functional elements having the same function as in the prior Figures are given the same reference numeral except for a suffix e. After description of the foregoing FIGS. 1-5, it is not believed that description of the operation of this Figure is necessary. This Figure does show, however, in addition to the active replicator, the fact that the gating functions can be located on one side of each loop.

From the foregoing, it can be seen that the performance of a chip can be optimized in a number of ways. First, with a folded-loop configuration as disclosed herein bubble manipulation means, such as a transfer-in ports and the transfer-out ports, are not located at a corner turn (i.e., the 180 degrees reversal area of the conventional storage loop) so that additional space is available for higher magnetic margin transfer elements, replicate elements and control conductors with less current caused field interaction with the adjacent propagate elements. Also, the use of a high current for replicating a bubble can be eliminated in those embodiments utilizing a passive or low current replicator, and the conductor thicknesses can be reduced, thus reducing the electromigration failures probability. Note, also, again, with the bubble storage area separated from the replicator, merge and detector areas, different current element periods can be used to ease mask alignment requirements. Also, a selection of various drive field circuits for all portions of the chip is allowed and by utilizing the folded loop configuration, the number of steps a bubble may take between one port and another may be adjusted. Also, illustrated in FIG. 6, is the utilization of either a separate or a shared detector with a multiplicity of storage arrays utilizing the folded loop configurations.

What is claimed is:

1. A bubble memory organization comprising:
a bubble propagation structure including magnetic elements disposed in an arrangement on which magnetic bubbles propagate element-to-element in response to a rotating in-plane magnetic field;
the arrangement including a predetermined number of storage loops having a number of said magnetic elements on which said bubbles circulate;
means for generating bubbles and for propagating said bubbles for transfer into said storage loops; and
a plurality of bubble manipulation devices for performing a desired function;
each storage loop containing at least one in-plane fold to vary the number of propagate elements so that said bubble manipulation devices can be selectively located relative to one another with some of said bubble manipulation devices being connected to and operable by one conductor for manipulating said bubbles relative to said storage loop and relative to other manipulation devices;
said other bubble manipulation devices being transfer-in ports and transfer-out ports for transferring bubbles into said storage loops and out of said storage loops and located on one side of each of said storage loops with one conductor line connected to both said ports for actuating said transfer-in or transfer-out of bubbles as desired.

2. The bubble memory organization as claimed in claim 1 further including a second transfer-out port, a passive replicator connected to said second transfer-out port but spaced from said storage loop for replicating bubbles transferred out at said second transfer-out port, and a merge port connected between said second transfer-out port and said passive replicator to allow replicated bubbles as well as non-transferred out bubbles to merge to continue to circulate in said storage loop.

3. The bubble memory organization as claimed in claim 2 wherein the number of propagate elements between said second transfer-out port and said merge port equals the number of propage elements between said second transfer-out ports, said passive replicator and said merge port.

4. The bubble memory organization as claimed in claim 3 including a second merge port connected with said passive replicator, detector means and means connecting said passive replicator and detector means for merging and transferring said replicate bubbles to said detector means.

5. A bubble memory organization comprising:
a bubble propagation structure including magnetic elements disposed in an arrangement on which magnetic bubbles propagate element-to-element in response to a rotating in-plane magnetic field;
the arrangement including a predetermined number of storage loops having a number of said magnetic elements on which said bubbles circulate;
means for generating bubbles and for propagating said bubbles for transfer into said storage loops;
a plurality of bubble manipulation devices for performing a desired function;
each storage loop containing at least one in-plane fold to vary the number of propagate elements so that said bubble manipulation devices can be selectively located relative to one another with some of said bubble manipulation devices being connected to and operable by one conductor for manipulating said bubbles relative to said storage loop and relative to other manipulation devices;
other of said bubble manipulation devices being transfer-in ports and transfer-out ports for transferring bubbles into said storage loops and out of said storage loops; and
wherein said transfer-in port and transfer-out port are located on opposite sides of the storage loop and further including a passive replicator and second transfer-out port for transferring bubbles out of said storage loop to said passive replicator where said bubbles are replicated and transferred to said second transfer-out port, both said transfer-out ports being connected by one conductor for activation thereby.

6. The bubble memory organization as claimed in claim 5 further including a merge port connected between both said transfer-out ports for merging replicate bubbles into said storage loop.

7. The bubble memory organization as claimed in claim 6 further including a second merge port connected to said passive replicator, detector means and means connecting said merge port to said detector means for merging and transferring replicate bubbles to said detector means.

8. The bubble memory organization as claimed in claim 7 wherein the number of propagate elements in said storage loop between said first transfer-out port and said merge port equals the number of propagate elements between said first transfer-out port, passive replicator, second transfer-out port or said merge port.

9. A bubble memory organization comprising:
a bubble propagation structure including magnetic elements disposed in an arrangement on which magnetic bubbles propagate element-to-element in response to a rotating in-plane magnetic field;
the arrangement including a predetermined number of storage loops having a number of said magnetic elements on which said bubbles circulate;
means for generating bubbles and for propagating said bubbles for transfer into said storage loops;
a plurality of bubble manipulation devices for performing a desired function;
each storage loop containing at least one in-plane fold to vary the number of propagate elements so that said bubble manipulation devices can be selectively located relative to one another with some of said bubble manipulation devices being connected to and operable by one conductor for manipulating said bubbles relative to said storage loop and relative to other manipulation devices; and
wherein said bubble manipulation device includes a passive replicator located in said storage loop for automatically replicating bubbles stored therein, a first transfer-out port for transferring bubbles out of said storage loop and a second transfer-out port connected to said passive replicator, both said transfer-out ports being connected by a single conductor for activation simultaneously.

10. A bubble memory organization as claimed in claim 9 further including a pair of annihilators each connected to said transfer-out ports for annihilating bubbles transferred thereto from said transfer-out ports, a detector means and a merge port connected between said second transfer-out port and said detector means for merging bubbles for transportation to said detector.

11. A bubble memory organization comprising:
a bubble propagation structure including magnetic elements disposed in an arrangement on which magnetic bubbles propagate element-to-element in response to a rotating in-plane magnetic field;
the arrangement including a predetermined number of storage loops having a number of said magnetic elements on which said bubbles circulate;
means for generating bubbles and for propagating said bubbles for transfer into said storage loops;
a plurality of bubble manipulation devices for performing a desired function;
each storage loop containing at least one in-plane fold to vary the number of propagate elements so that said bubble manipulation devices can be selectively located relative to one another with some of said bubble manipulation devices being connected to and operable by one conductor for manipulating said bubbles relative to said storage loop and relative to other manipulation devices; and
wherein said bubble manipulation devices include a transfer-in port and a final merge port connected to said means for generating bubbles and for propagating bubbles for transfer into said storage loops;
a second merge port connected to said transfer-in port and an active replicate/transfer gate connected to said first merge port;
and detector means connected to said first merge port.

12. The bubble memory organization as claimed in claim 11 wherein one conductor connects said transfer-in port and said replicate/transfer-out port for activation thereby.

13. The bubble memory organization as claimed in claim 12 wherein all the said bubble manipulation devices are located on one side of said storage loop, and wherein all in-plane folds are located at the side of said storage loop opposite said bubble manipulation device.

14. The bubble memory organization as claimed in claim 13 wherein the number of propagate elements between transfer-in port and said first merge port equals the number of propagate elements between second merge port and said replicate/transfer-out port and the number of propagate elements between said transfer-in port and said second merge port equals the number of propagate elements between said replicate/transfer-out ports and said first merge port.

15. A bubble memory organization comprising:
a bubble propagation structure including magnetic elements disposed in an arrangement on which magnetic bubbles propagate element-to-element in response to a rotating in-plane magnetic field;
the arrangement including a predetermined number of storage loops having a number of said magnetic elements on which said bubbles circulate;
means for generating bubbles and for propagating said bubbles for transfer into said storage loops;
a plurality of bubble manipulation devices for performing a desired function;
each storage loop containing at least one in-plane fold to vary the number of propagate elements so that said bubble manipulation devices can be selectively located relative to one another with some of said bubble manipulation devices being connected to and operable by one conductor for manipulating said bubbles relative to said storage loop and relative to other manipulation devices;
a transfer-in port and a final merge port connected to said means for generating bubbles and for propagating bubbles for transfer into said storage loops;
a second merge port connected to said transfer-in port and a replicator/transfer gate connected to said final merge port; and
detector means connected to said final merge port.

16. The bubble memory organization as claimed in claim 15 wherein one conductor connects said transfer-in port and said replicate/transfer-out port for activation thereby.

17. A bubble memory organization comprising:
a magnetic bubble domain propagation structure including magnetic elements on which bubbles propagate element-to-element in response to a rotating in-plane magnetic field, said propagate elements defining bubble flow tracks,
a plurality of bubble manipulation devices for performing a desired function and oriented on said structure differently from each other and relative to different field directions of said rotating in-plane magnetic field,
each said bubble manipulation devices being located to receive bubbles from one flow track and to direct said received bubbles to a second flow track, and
a single electrical conductor means coupled to said plurality of bubble manipulation devices to activate said devices to direct said bubbles onto said second flow track in response to the application of a current pulse on said electrical conductor means,
said current pulse being applied at selected field directions of said rotating in-plane magnetic field which activates certain of said bubble manipulation devices and not others depending on the orientation of said devices.

18. The bubble memory organization as claimed in claim 17, wherein said electrical conductor means forms current loops at each bubble manipulation device, said current loops being oriented to correspond to the orientation of said devices.

19. The bubble memory organization as claimed in claim 18, wherein said current loops are oriented 180° relative to one another so as to make said bubble manipulation devices responsive to pulses in a first field direction not responsive to pulses in a field direction oriented 180° to the first field direction.

20. A magnetic memory organization comprising:
a magnetic bubble domain propagation structure including propagate elements on which domains propagate element-to-element in response to a rotating in-plane magnetic field,
a plurality of said propagate elements arranged in a loop configuration,
a plurality of propagate elements defining four bubble tracks and having four bubble manipulation devices located diagonally opposite each other and connecting said flow tracks,
two of the diagonally opposite bubble manipulation devices respectively being transfer-in port and a transfer-out/replicate port, said transfer-out replicate port being adjacent said loop configuration, and
electrical conductor means associated with said transfer-in port and transfer-out/replicate port to cause magnetic bubble domains to transfer from one bubble track to another in response to the application of a pulse to said electrical conductor means.

21. The organization as claimed in claim 20, wherein a merge port is located between said transfer-in port and transfer-out/replicate port and forming the inlet to said loop configuration.

22. The organization as claimed in claim 20, wherein the transfer-in port and the transfer-out/replicate port are each at the beginning of a bubble track and facing in opposite directions to be responsive to a current pulse applied at different times in the rotation of said in-plane field.

23. The organization as claimed in claim 22, wherein one bubble forms part of the loop configuration.

24. The organization as claimed in claim 22, wherein said loop configuration is a folded loop type.

25. The structure as claimed in claim 22 including an inlet track of propagate elements connecting said transfer-in port with a bubble generator and an output track of propagate elements connecting both said transfer-in port and transfer-out/replicate port with a bubble detector.

* * * * *